US00RE47782E

(19) United States
(12) Reissued Patent
Chen et al.

(10) Patent Number: US RE47,782 E
(45) Date of Reissued Patent: Dec. 24, 2019

(54) MULTI-CHANNEL TRANSCEIVER

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Yen-Chung Chen, Santa Clara, CA (US); Shan-Jie Wang, Hsinchu (TW); Cheng-Hung Wu, Hsinchu (TW); Tsai-Ming Yang, Tainan (TW)

(73) Assignees: GLOBAL UNICHIP CORPORATION, Hsinchu (TW); TAIWAN SEMICONDUCTOR MANUFACTURING CO., LTD., Hsin-Chu (TW)

(21) Appl. No.: 15/392,532

(22) Filed: Dec. 28, 2016

Related U.S. Patent Documents

Reissue of:
(64) Patent No.: 9,312,910
Issued: Apr. 12, 2016
Appl. No.: 14/686,993
Filed: Apr. 15, 2015

(51) Int. Cl.
*H04B 1/7085* (2011.01)
*H04L 7/033* (2006.01)
*H04L 7/00* (2006.01)

(52) U.S. Cl.
CPC ..... *H04B 1/7085* (2013.01); *H04L 7/0025* (2013.01); *H04L 7/0331* (2013.01); *H04B 2201/7073* (2013.01)

(58) Field of Classification Search
CPC ..... H03M 9/00; H04B 15/00
See application file for complete search history.

(56) References Cited

U.S. PATENT DOCUMENTS

2011/0019718 A1* 1/2011 Chiang ..... H04B 14/06 375/141
2011/0034133 A1* 2/2011 Rofougaran ..... H04B 1/0067 455/77
2011/0109355 A1* 5/2011 Sakaguchi ..... H03L 7/23 327/157
2012/0287967 A1* 11/2012 Ogasawara ..... H03L 7/197 375/146

* cited by examiner

*Primary Examiner* — Woo H. Choi
(74) *Attorney, Agent, or Firm* — WAPT, PC

(57) ABSTRACT

A multi-channel transceiver includes a phase-locked loop circuit, a first transmitting channel and a second transmitting channel. The phase-locked loop circuit generates a first clock signal set and a second clock signal set with different frequencies. The first transmitting channel includes a first phase adjusting circuit and a first transmitter. The first phase adjusting circuit receives the first clock signal set and generates a first spread spectrum clock signal with a first SSCG profile. According to the first spread spectrum clock signal, the first transmitter generates a first serial data. The second transmitting channel includes a second phase adjusting circuit and a second transmitter. The second phase adjusting circuit receives the second clock signal set and generates a second spread spectrum clock signal with a second SSCG profile. According to the second spread spectrum clock signal, the second transmitter generates a second serial data.

12 Claims, 3 Drawing Sheets

MULTI-CHANNEL TRANSCEIVER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD OF THE INVENTION

The present invention relates to a transceiver, and more particularly to a multi-channel transceiver for generating plural spread spectrum clock signals with various SSCG profiles.

BACKGROUND OF THE INVENTION

According to the protocols of the Federal Communication Commission (FCC) and the International Electrotechnical Commission (IEC), the power of electromagnetic interference (EMI) needs to be confined within a regulatory limit. Consequently, a synchronous digital system is usually equipped with a spread spectrum clock generator (SSCG) to reduce the spectral density of electromagnetic interference. For example, the synchronous digital system is a transceiver for a PCIe bus, a SATA bus or a SAS bus.

FIG. 1 is a schematic circuit block diagram illustrating a conventional multi-channel transceiver. As shown in FIG. 1, the multi-channel transceiver 100 comprises a spread spectrum clock generator 120 and M serializers/deserializers (also referred as Ser/Des) 111~11m. The channel corresponding to each of the serializers/deserializers 111~11m may perform the conversion between parallel data and serial data.

Take the channel corresponding to the serializer/deserializer 111 and a first input/output port I/O1 for example. The serializer/deserializer 111 may receive a first parallel data PDATA1 and convert the first parallel data PDATA1 into a first serial data SDATA1 according to a spread spectrum clock signal SSCLK. Consequently, the first serial data SDATA1 is outputted from the first input/output port I/O1. Similarly, the serializer/deserializer 111 may receive the first serial data SDATA1 from the first input/output port I/O1 and convert the first serial data SDATA1 into the first parallel data PDATA1 according to the spread spectrum clock signal SSCLK.

The conventional multi-channel transceiver 100 is only equipped with one spread spectrum clock generator 120 to generate the spread spectrum clock signal SSCLK and transmit the spread spectrum clock signal SSCLK to all of the serializers/deserializers 111~11m. Consequently, the conversions between the parallel data PDATA1~PDATAm and the serial data SDATA1~SDATAm are performed by the serializers/deserializers 111~11m according to the spread spectrum clock signal SSCLK.

Generally, the spread spectrum clock generator 120 comprises a phase-locked loop circuit (PLL) and a delta-sigma modulation circuit so as to generate the spread spectrum clock signal SSCLK with a spread spectrum clocking frequency deviation. In other words, the spread spectrum clock generator 120 may generate various SSCG profiles according to the spread spectrum clocking frequency deviations of different specifications.

For example, in case that the data rate for a SATA bus is 1.5 Gbps, the spread spectrum clocking frequency deviation is down spread to −5000 ppm. Consequently, the frequency of the spread spectrum clock signal SSCLK is in the range between 1.5 GHz~1.425 GHz, which is the SSCG profile of the spread spectrum clock signal SSCLK at 1.5 GHz. Whereas, in case that the data rate for a SATA bus is 6 Gbps, the spread spectrum clocking frequency deviation is center spread from +2300 ppm to −2300 ppm. Consequently, the frequency of the spread spectrum clock signal SSCLK is in the range between the 6.138 GHz and 5.862 GHz, which is the SSCG profile of the spread spectrum clock signal SSCLK at 6 GHz.

According to the specifications, all channels of the multi-channel transceiver 100 need to use different SSCG profiles to support different data rates. For example, the data rates for the SATA bus may be 1.5 Gbps, 3 Gbps, 6 Gbps and 12 Gbps and varied according to different spread spectrum clocking frequency deviations. However, since the conventional multi-channel transceiver 100 is only equipped with one spread spectrum clock generator 120, the generated spread spectrum clock signal SSCLK only has a single SSCG profile. In other words, all channels of the conventional multi-channel transceiver 100 cannot provide various SSCG profiles to support different data rates.

Moreover, the serializers/deserializers 111~11m generate sampling clocks according to the spread spectrum clock signal SSCLK, and samples the received serial data SDATA1~SDATAm according to the sampling clocks. However, since the spread spectrum clock signal SSCLK is generated by the spread spectrum clock generator 120, the sampling clocks also have the clocking frequency deviations. Due to the clocking frequency deviations of the sampling clocks, the sampling time margin is reduced and the performance of the multi-channel transceiver 100 is impaired.

SUMMARY OF THE INVENTION

The present invention provides a multi-channel transceiver using a single phase-locked loop circuit to generate plural clock signal sets with different frequencies. In plural transmitting channels, the spread spectrum clock signals with various SSCG profiles are generated according to different frequencies and the corresponding spread spectrum clocking frequency deviations. According to the spread spectrum clock signals, corresponding serial data are outputted from the transmitting channels.

An embodiment of the present invention provides a multi-channel transceiver. The multi-channel transceiver includes a phase-locked loop circuit, a first transmitting channel and a second transmitting channel. The phase-locked loop circuit generates a first clock signal set and a second clock signal set, wherein the first clock signal set and the second clock signal set have different frequencies. The first transmitting channel includes a first phase adjusting circuit and a first transmitter. The first phase adjusting circuit receives the first clock signal set and generates a first spread spectrum clock signal with a first spread spectrum clock generator profile. According to the first spread spectrum clock signal, the first transmitter generates a first serial data. The second transmitting channel includes a second phase adjusting circuit and a second transmitter. The second phase adjusting circuit receives the second clock signal set and generates a second spread spectrum clock signal with a second spread spectrum clock generator profile. According to the second spread spectrum clock signal, the second transmitter generates a second serial data.

In an embodiment, the multi-channel transceiver further includes a first receiving channel and a second receiving channel. The first receiving channel includes a first receiver and a first clock and data recovery circuit. A third serial data is received by the first receiver and transmitted to the first clock and data recovery circuit. A first sampling clock is generated by the first clock and data recovery circuit according to a first specified clock signal of the first clock signal set. The third serial data is sampled according to the first sampling clock. The second receiving channel includes a second receiver and a second clock and data recovery circuit. A fourth serial data is received by the second receiver and transmitted to the second clock and data recovery circuit. A second sampling clock is generated by the second clock and data recovery circuit according to a second specified clock signal of the second clock signal set. The fourth serial data is sampled according to the second sampling clock.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
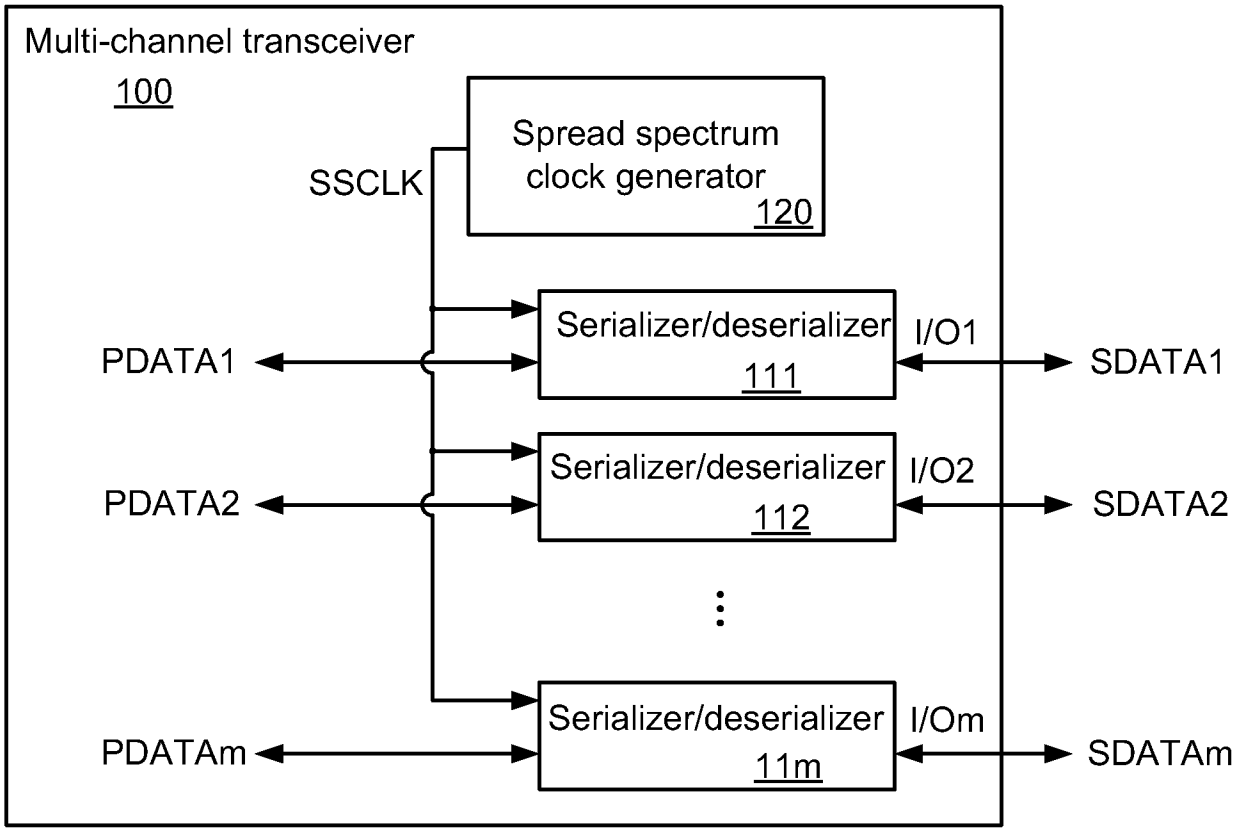
FIG. 1 (PRIOR ART)
FIG. 1 (prior art) is a schematic circuit block diagram illustrating a conventional multi-channel transceiver.
Figure 2:
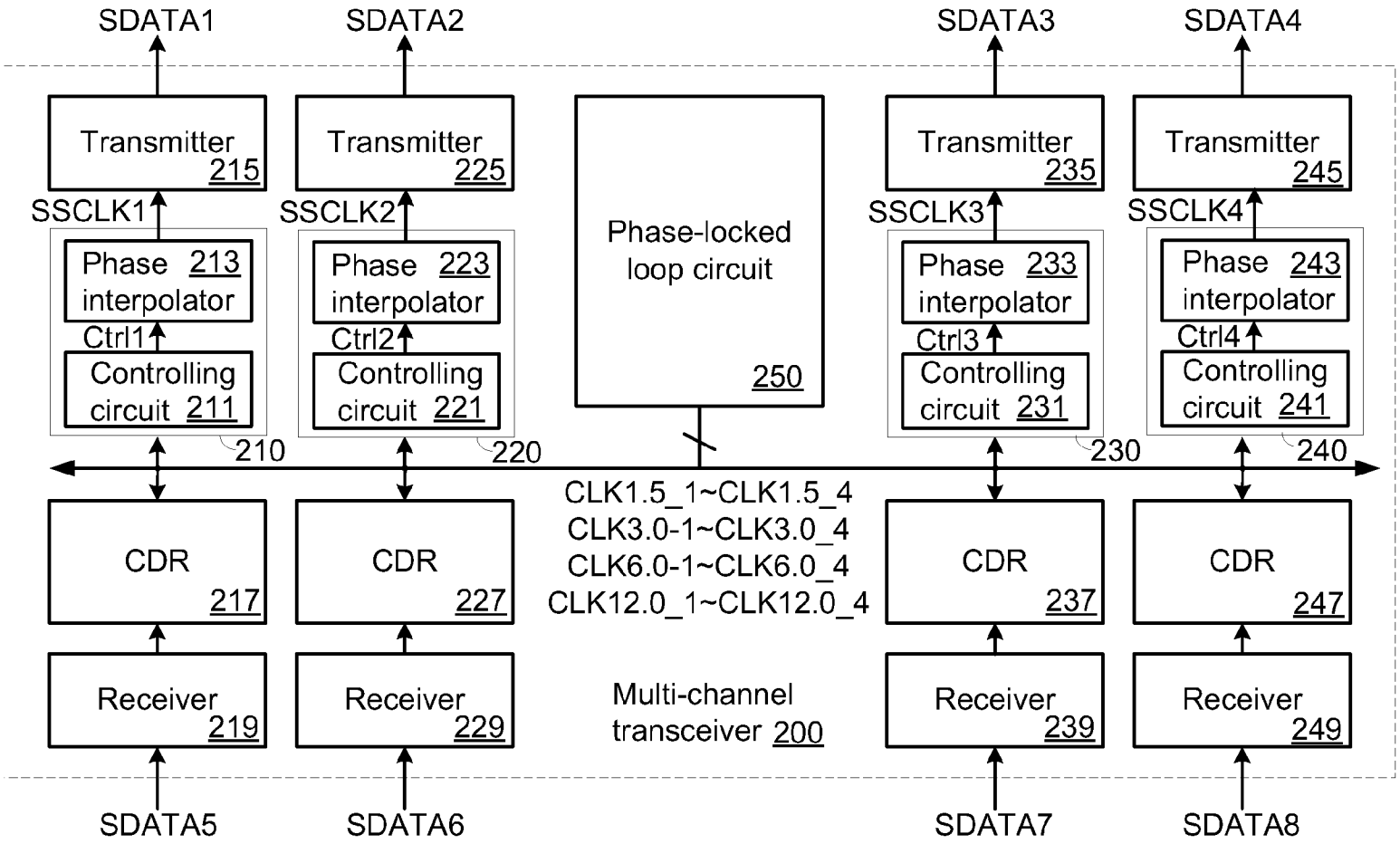
FIG. 2 is a schematic circuit block diagram illustrating a multi-channel transceiver according to an embodiment of the present invention.

FIG. 2 is a schematic circuit block diagram illustrating a multi-channel transceiver according to an embodiment of the present invention. As shown in FIG. 2, the multi-channel transceiver 200 comprises four transmitting channels and four receiving channels. The number of the transmitting channels and the number of the receiving channels are presented herein for purpose of illustration and description only. It is noted that the number of the transmitting channels and the number of the receiving channels may be varied according to the practical requirements.

A phase-locked loop circuit 250 of the multi-channel transceiver 200 comprises plural frequency dividers (not shown) for generating various clock signal sets with accurate frequencies. For example, these clock signal sets comprise a 12 GHz clock signal set CLK12.0-1~CLK12.0_4, a 6 GHz clock signal set CLK6.0_1~CLK6.0_4, a 3 GHz clock signal set CLK3.0_1~CLK3.0_4 and a 1.5 GHz clock signal set CLK1.5_1~CLK1.5_4.

Moreover, each clock signal set contains four clocks signal, wherein the phase difference between every two adjacent clock signals is 90 degrees. For example, in the 12 GHz clock signal set CLK12.0-1~CLK12.0_4, the phase of the clock signal CLK12.0_1 leads the phase of the clock signal CLK12.0_2 by 90 degrees, the phase of the clock signal CLK12.0_1 leads the phase of the clock signal CLK12.0_3 by 180 degrees, and the phase of the clock signal CLK12.0_1 leads the phase of the clock signal CLK12.0_4 by 270 degrees. The phase differences between the clock signals of other clock signal sets are identical to the phase differences between the clock signals of the 12 GHz clock signal set CLK12.0-1~CLK12.0_4, and are not redundantly described herein.

The first transmitting channel comprises a phase adjusting circuit 210 and a transmitter 215. The second transmitting channel comprises a phase adjusting circuit 220 and a transmitter 225. The third transmitting channel comprises a phase adjusting circuit 230 and a transmitter 235. The fourth transmitting channel comprises a phase adjusting circuit 240 and a transmitter 245. The phase adjusting circuit 210 comprises a controlling circuit 211 and a phase interpolator (PI) 213. The phase adjusting circuit 220 comprises a controlling circuit 221 and a phase interpolator 223. The phase adjusting circuit 230 comprises a controlling circuit 231 and a phase interpolator 233. The phase adjusting circuit 240 comprises a controlling circuit 241 and a phase interpolator 243. For brevity, only the first transmitting channel comprising the phase adjusting circuit 210 and the transmitter 215 will be illustrated as follows. The operating principles of other transmitting channels are similar to those of the first transmitting channel, and are not redundantly described herein.

If the data rate of the transmitting channel is 1.5 Gbps and the spread spectrum clocking frequency deviation is down spread to −5000 ppm, the phase interpolator 213 of the phase adjusting circuit 210 receives the clock signal set CLK1.5_1~CLK1.5_4. Moreover, the controlling circuit 211 issues a control signal Ctrl1 to the phase interpolator 213. According to the control signal Ctrl1, the phase adjusting circuit 210 generates a spread spectrum clock signal SSCLK1 with a 1.5 GHz-SSCG profile. That is, the frequency of the spread spectrum clock signal SSCLK1 is in the range between 1.5 GHz~1.425 GHz. According to the spread spectrum clock signal SSCLK1, the transmitter 215 generates a serial data SDATA1. Consequently, the serial data SDATA1 is transmitted at a data rate of 1.5 Gbps. In an embodiment, the transmitter 215 comprises a serializer/deserializer (not shown) for converting a parallel data into the serial data SDATA1.

Similarly, if the data rate of the transmitting channel is 6 Gbps and the spread spectrum clocking frequency deviation is center spread from +2300 ppm to −2300 ppm, the phase interpolator 213 of the phase adjusting circuit 210 receives the clock signal set CLK6.0_1~CLK6.0_4. Moreover, the controlling circuit 211 issues the control signal Ctrl1 to the phase interpolator 213. According to the control signal Ctrl1, the phase adjusting circuit 210 generates the spread spectrum clock signal SSCLK1 with a 6 GHz-SSCG profile. That is, the frequency of the spread spectrum clock signal SSCLK1 is in the range between 6.138 GHz~5.862 GHz. According to the spread spectrum clock signal SSCLK1, the transmitter 215 generates the serial data SDATA1. Consequently, the serial data SDATA1 is transmitted at a data rate of 6 Gbps.

In addition to the above two SSCG profiles, the spread spectrum clock signal SSCLK1 with other SSCG profiles may be produced according to another data rate (e.g. 3 Gbps or 12 Gbps) of the transmitting channel and the corresponding spread spectrum clocking frequency deviation.

Moreover, the first receiving channel comprises a clock and data recovery circuit (CDR) 217 and a receiver 219, the second receiving channel comprises a clock and data recovery circuit 227 and a receiver 229, the third receiving channel comprises a clock and data recovery circuit 237 and a receiver 239, and the fourth receiving channel comprises a clock and data recovery circuit 247 and a receiver 249. For brevity, only the first receiving channel comprising the clock and data recovery circuit 217 and the receiver 219 will be illustrated as follows. The operating principles of other receiving channels are similar to those of the first receiving channel, and are not redundantly described herein.

After a serial data SDATA5 from an external circuit (not shown) is received by the receiver 219, the serial data SDATA5 is transmitted from the receiver 219 to the clock and data recovery circuit 217. By the clock and data recovery circuit 217, a sampling clock of the serial data SDATA5 is reconstructed and the serial data SDATA5 is converted into the parallel data according to the sampling clock.

For example, if the serial data SDATA5 with a data rate of 1.5 Gbps and with a spread spectrum clocking frequency deviation is received by the receiver 219, the sampling clock is reconstructed by the clock and data recovery circuit 217 according to any clock signal of the clock signal set CLK1.5_1~CLK1.5_4 (e.g. the clock signal CLK1.5_1). Moreover, the serial data SDATA5 is converted into the parallel data according to the sampling clock.

Obviously, since the sampling clock is reconstructed by the clock and data recovery circuit 217 according to the clock signal CLK1.5_1 with the accurate frequency, the sampling clock has no spread spectrum clocking frequency deviation. That is, the sampling clock has the accurate frequency (e.g. 1.5 GHz). Since the serial data SDATA5 is converted into the parallel data according to the sampling clock with the accurate frequency, the sampling time margin is increased. Under this circumstance, the accuracy of the sampled data is increased, and the performance of the multi-channel transceiver 200 is enhanced.

Similarly, if the serial data SDATA5 with another data rate and with a spread spectrum clocking frequency deviation is received by the receiver 219, the sampling clock is reconstructed by the clock and data recovery circuit 217 according to the corresponding clock signal set. Moreover, the serial data SDATA5 is converted into the parallel data according to the sampling clock.

From the above descriptions, the present invention provides the multi-channel transceiver 200. The multi-channel transceiver 200 is equipped with one phase-locked loop circuit 250. By the phase-locked loop circuit 250 and corresponding phase adjusting circuits of the plural transmitting channels, the spread spectrum clock signals SSCLK1~SSCLK4 with various SSCG profiles are generated according to different frequencies and the corresponding spread spectrum clocking frequency deviations. Moreover, the transmitters 215, 225, 235 and 245 generate and output the serial data SDATA1~SDAD4 according to the received spread spectrum clock signals SSCLK1~SSCLK4, respectively.

Figure 3:
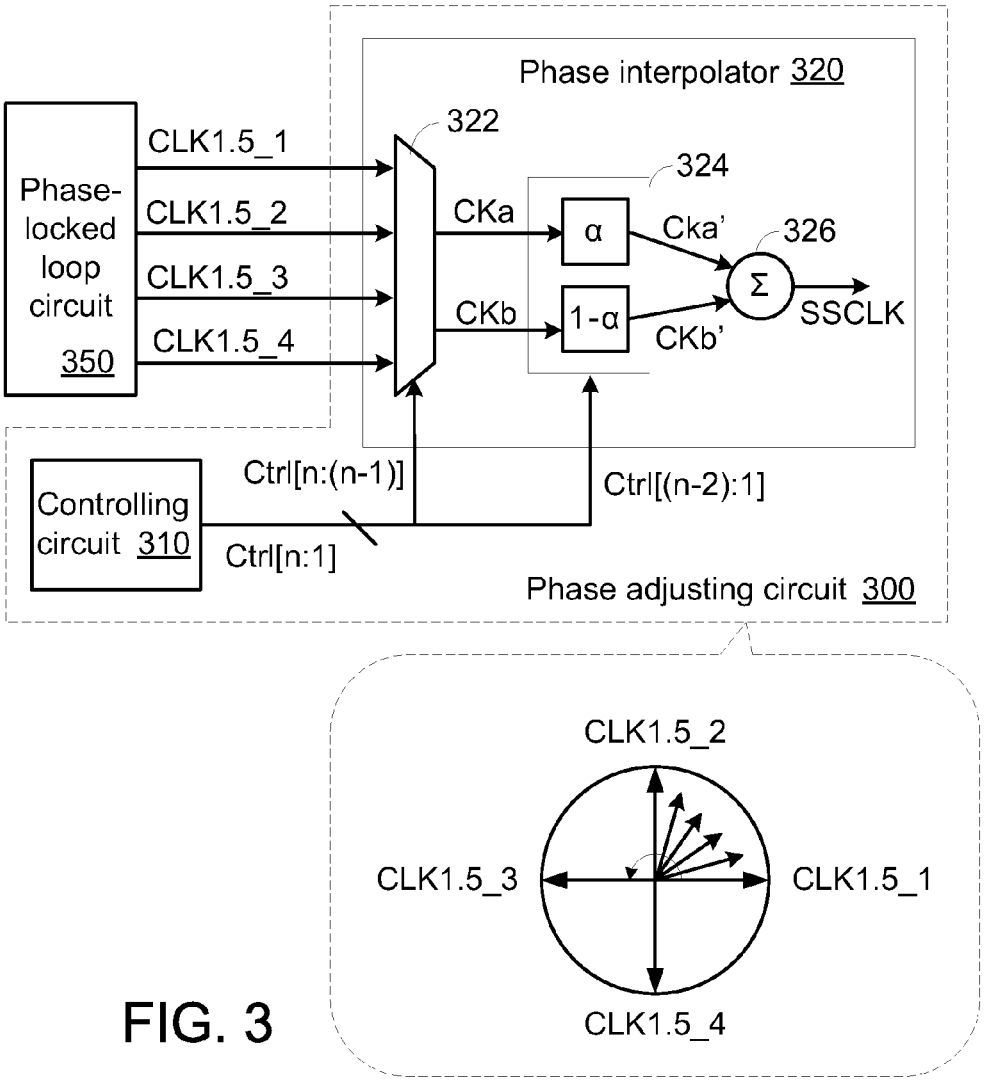
FIG. 3 is a schematic circuit block diagram illustrating a phase adjusting circuit of the multi-channel transceiver according to the embodiment of the present invention.

FIG. 3 is a schematic circuit block diagram illustrating a phase adjusting circuit of the multi-channel transceiver according to the embodiment of the present invention. The phase adjusting circuit 300 may be applied to any transmitting channel of the multi-channel transceiver 200.

As shown in FIG. 3, the phase adjusting circuit 300 comprises a controlling circuit 310 and a phase interpolator 320. The controlling circuit 310 may issue an n-bit control signal Ctrl[n:1] to the phase interpolator 320. Moreover, according to the control signal Ctrl[n:1], the phase interpolator 320 selects one clock signal set that is generated by the phase-locked loop circuit 350 and generate the spread spectrum clock signal SSCLK according to the clock signal set. In FIG. 3, the phase interpolator 320 select the clock signal set CLK1.5_1~CLK1.5_4. It is noted that the phase interpolator 320 may select another clock signal set to generate the corresponding spread spectrum clock signal SSCLK.

The phase interpolator 320 comprises a selector 322, a weighting controller 324 and a combiner 326. The selector 322 may receive a two-bit control signal Ctrl[n:(n−1)]. According to control signal Ctrl[n:(n−1)], the selector 322 selects two of the clock signals of the clock signal set CLK1.5_1~CLK1.5_4 as the selected clock signals Cka and CKb.

For example, if the control signal Ctrl[n:(n−1)] is [0:0], the selector 322 may output the clock signals CLK1.5_1 and CLK1.5_2 as the selected clock signals CKa and CKb, respectively. Moreover, if the control signal Ctrl[n:(n−1)] is [0:1], the selector 322 may output the clock signals CLK1.5_2 and CLK1.5_3 as the selected clock signals CKa and CKb, respectively. Moreover, if the control signal Ctrl [n:(n−1)] is [1:0], the selector 322 may output the clock signals CLK1.5_3 and CLK1.5_4 as the selected clock signals CKa and CKb, respectively. Moreover, if the control signal Ctrl[n:(n−1)] is [1:1], the selector 322 may output the clock signals CLK1.5_4 and CLK1.5_1 as the selected clock signals CKa and CKb, respectively.

The weighting controller 324 may receive the (n−2)-bit control signal Ctrl[(n−2):1]. According to the control signal Ctrl[(n−2):1], a weighting parameter a of the weighting controller 324 is correspondingly adjusted. In this embodiment, the weighting parameter a is larger than or equal to 0 and smaller than or equal to 1. The weighting controller 324 may multiple the clock signal CKa by the weighting parameter a so as to generate a weighted clock signal CKa'. Moreover, the weighting controller 324 may multiple the clock signal CKa by $(1-\alpha)$ so as to generate a weighted clock signal CKb'.

After the clock signal CKa' and the clock signal CKb' are combined together by the combiner 326, the spread spectrum clock signal SSCLK is generated.

In this embodiment, the phase interpolator 320 may produce clock signals with any phase difference between 0 and 360 degrees according to the four 90-degree phase-shifted clock signals. Moreover, due to the increment value or the decrement value of the control signal Ctrl[n:1], the phases of the clock signals may be rotated clockwise or counterclockwise. In other words, the SSCG profile may be determined according to the increment value, the decrement value and the changing rate of the control signal Ctrl[n:1] which are adjusted by the controlling circuit 310.

For example, if the control signal Ctrl[n:1] is a six-bit control signal (i.e. n=6) and the control signal Ctrl[n:1] has one increment per 32 clock cycles, the resolution of the phase interpolator 320 is equal to $1/2^n=1/2^6=1/64$. Under this circumstance, the spread spectrum clocking frequency deviation is equal to $(1/64)/(32)=488$ ppm. That is, the SSCG profile is down spread to 488 ppm.

On the other hand, if the control signal Ctrl[n:1] is a six-bit control signal (i.e. n=6) and the control signal Ctrl [n:1] has one decrement per 32 clock cycles, the resolution of the phase interpolator 320 is equal to $1/2^n=1/2^6=1/64$. Under this circumstance, the spread spectrum clocking frequency deviation is equal to $(1/64)/(32)=488$ ppm. That is, the SSCG profile is up spread to 488 ppm.

On the other hand, if the control signal Ctrl[n:1] is a six-bit control signal (i.e. n=6) and the control signal Ctrl [n:1] has eight increments per 32 clock cycles, after a 5 GHz is inputted into the phase adjusting circuit 300, the spread spectrum clocking frequency deviation is $(1/64)\times(8)/(-32)=-3906$ ppm. That is, the frequency change of the spread spectrum clock signal SSCLK may be expressed as $\Delta f=5$ GHz×3906 ppm=19.53 MHz.

Figure 4:
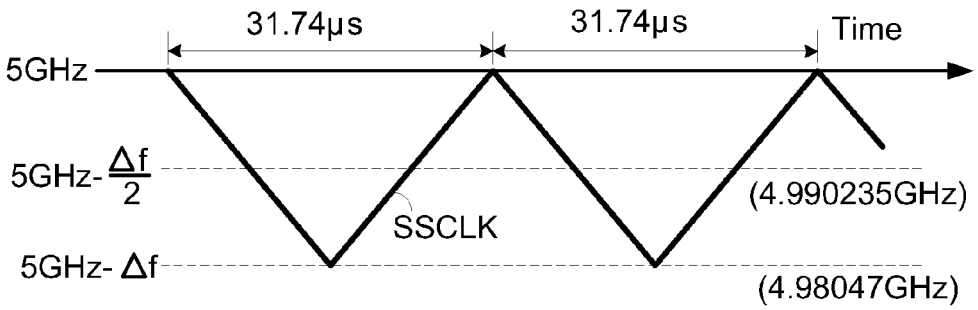
FIG. 4 schematically illustrates the frequency of the spread spectrum clock signal SSCLK with the varying time.

FIG. 4 schematically illustrates the frequency of the spread spectrum clock signal SSCLK with the varying time. When a 5 GHz is inputted into the phase adjusting circuit 300, the frequency of the spread spectrum clock signal SSCLK is changed from 5 GHz to 4.98047 GHz and from 4.98047 GHz to 5 GHz during the 31.47 μs period.

In the above embodiment, the multi-channel transceiver of the present invention comprises plural transmitting channels and plural receiving channels. It is noted that numerous modifications and alterations may be made while retaining the teachings of the invention. For example, in another embodiment, the multi-channel transceiver of the present invention may only comprise plural transmitting channels. Alternatively, in another embodiment, the multi-channel transceiver of the present invention may only comprise plural receiving channels.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-channel transceiver, comprising:

a phase-locked loop circuit for generating a first clock signal set and a second clock signal set, wherein the first clock signal set and the second clock signal set have different frequencies;

a first transmitting channel comprising a first phase adjusting circuit and a first transmitter, wherein the first phase adjusting circuit receives the first clock signal set and generates a first spread spectrum clock signal with a first spread spectrum clock generator profile, wherein according to the first spread spectrum clock signal, the first transmitter generates a first serial data, and the first transmitter comprises a serializer for converting a parallel data into the first serial data; and a second transmitting channel comprising a second phase adjusting circuit and a second transmitter, wherein the second phase adjusting circuit receives the second clock signal set and generates a second spread spectrum clock signal with a second spread spectrum clock generator profile, wherein according to the second spread spectrum clock signal, the second transmitter generates a second serial data.

2. The multi-channel transceiver as claimed in claim 1, further comprising:

a first receiving channel comprising a first receiver and a first clock and data recovery circuit, wherein a third serial data is received by the first receiver and transmitted to the first clock and data recovery circuit, and a first sampling clock is generated by the first clock and data recovery circuit according to a first specified clock signal of the first clock signal set, wherein the third serial data is sampled according to the first sampling clock; and a second receiving channel comprising a second receiver and a second clock and data recovery circuit, wherein a fourth serial data is received by the second receiver and transmitted to the second clock and data recovery circuit, and a second sampling clock is generated by the second clock and data recovery circuit according to a second specified clock signal of the second clock signal set, wherein the fourth serial data is sampled according to the second sampling clock.

3. The multi-channel transceiver as claimed in claim 1, wherein the first phase adjusting circuit comprises:

a first controlling circuit for generating a first control signal; and a first phase interpolator for selecting the first clock signal set according to the first control signal, thereby generating the first spread spectrum clock signal.

4. The multi-channel transceiver as claimed in claim 3, wherein the first clock signal set contains four 90-degree phase-shifted clock signals, the first control signal has n bits, and the first phase interpolator comprises:

a selector for receiving the 90-degree phase-shifted clock signals and selectively generating a first selected clock signal and a second selected clock signal according to two bits of the first control signal;

a weighting controller for adjusting a weighting parameter according to other (n−2) bits of the first control signal, wherein the weighting controller multiples the first selected clock signal by the weighting parameter to generate a first weighted clock signal, and the weighting controller multiples the second selected clock signal by a difference between 1 and the weighting parameter to generate a second weighted clock signal, wherein the weighting parameter is larger than or equal to 0 and smaller than or equal to 1; and a combiner for combining the first weighted clock signal and the second weighted clock signal, thereby generating the first spread spectrum clock signal.

5. The multi-channel transceiver as claimed in claim 4, wherein a spread spectrum clocking frequency deviation is obtained according to an increment value, a decrement value or a changing rate of the first control signal, and the first spread spectrum clock generator profile is determined according to the spread spectrum clocking frequency deviation.

6. The multi-channel transceiver as claimed in claim 1, wherein the second phase adjusting circuit comprises:

a second controlling circuit for generating a second control signal; and a second phase interpolator for selecting the second clock signal set according to the second control signal, thereby generating the second spread spectrum clock signal.

7. A multi-channel transceiver, comprising:

a phase-locked loop circuit for generating a first clock signal set and a second clock signal set, wherein the first clock signal set and the second clock signal set have different frequencies;

a first transmitting channel comprising a first phase adjusting circuit and a first transmitter, wherein the first phase adjusting circuit receives the first clock signal set and generates a first spread spectrum clock signal with a first spread spectrum clock generator profile, wherein according to the first spread spectrum clock signal, the first transmitter generates a first serial data;

a second transmitting channel comprising a second phase adjusting circuit and a second transmitter, wherein the second phase adjusting circuit receives the second clock signal set and generates a second spread spectrum clock signal with a second spread spectrum clock generator profile, wherein according to the second spread spectrum clock signal, the second transmitter generates a second serial data;

a first receiving channel comprising a first receiver and a first clock and data recovery circuit, wherein a third serial data is received by the first receiver and transmitted to the first clock and data recovery circuit, and a first sampling clock is generated by the first clock and data recovery circuit according to a first specified clock signal of the first clock signal set, wherein the third serial data is sampled according to the first sampling clock; and a second receiving channel comprising a second receiver and a second clock and data recovery circuit, wherein a fourth serial data is received by the second receiver and transmitted to the second clock and data recovery circuit, and a second sampling clock is generated by the second clock and data recovery circuit according to a second specified clock signal of the second clock signal set, wherein the fourth serial data is sampled according to the second sampling clock.

8. The multi-channel transceiver as claimed in claim 7, wherein the first phase adjusting circuit comprises:

a first controlling circuit for generating a first control signal; and a first phase interpolator for selecting the first clock signal set according to the first control signal, thereby generating the first spread spectrum clock signal.

9. The multi-channel transceiver as claimed in claim 8, wherein the first clock signal set contains four 90-degree phase-shifted clock signals, the first control signal has n bits, and the first phase interpolator comprises:

a selector for receiving the 90-degree phase-shifted clock signals and selectively generating a first selected clock signal and a second selected clock signal according to two bits of the first control signal;

a weighting controller for adjusting a weighting parameter according to other (n−2) bits of the first control signal, wherein the weighting controller multiples the first selected clock signal by the weighting parameter to generate a first weighted clock signal, and the weighting controller multiples the second selected clock signal by a difference between 1 and the weighting parameter to generate a second weighted clock signal, wherein the weighting parameter is larger than or equal to 0 and smaller than or equal to 1; and a combiner for combining the first weighted clock signal and the second weighted clock signal, thereby generating the first spread spectrum clock signal.

10. The multi-channel transceiver as claimed in claim 9, wherein a spread spectrum clocking frequency deviation is obtained according to an increment value, a decrement value or a changing rate of the first control signal, and the first spread spectrum clock generator profile is determined according to the spread spectrum clocking frequency deviation.

11. The multi-channel transceiver as claimed in claim 7, wherein the second phase adjusting circuit comprises:

a second controlling circuit for generating a second control signal; and a second phase interpolator for selecting the second clock signal set according to the second control signal, thereby generating the second spread spectrum clock signal.

12. The multi-channel transceiver as claimed in claim 7, wherein the first transmitter comprises a serializer for converting a parallel data into the first serial data.

* * * * *